(12) United States Patent
Hassner et al.

(10) Patent No.: US 6,233,714 B1
(45) Date of Patent: May 15, 2001

(54) GENERALIZED METHOD AND MEANS FOR DEFINING AND OPERATING A (D, K) PARTIAL-RESPONSE ML DETECTOR OF BINARY-CODED SEQUENCES

(75) Inventors: Martin Aureliano Hassner, Mountain View; Nyles Heise, San Jose, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/124,327

(22) Filed: Jul. 29, 1998

(51) Int. Cl.[7] ................................................. H03M 13/03
(52) U.S. Cl. ........................................... 714/794; 375/341
(58) Field of Search ..................................... 714/794, 795, 714/796, 786; 709/300; 375/341; 341/59

(56) References Cited

U.S. PATENT DOCUMENTS

| | | | |
|---|---|---|---|
| 4,413,251 | 11/1983 | Adler et al. | 341/59 |
| 4,736,321 | 4/1988 | Brown et al. | 709/300 |
| 4,945,538 | 7/1990 | Patel | 714/786 |
| 4,964,126 | * 10/1990 | Musicus et al. | 714/797 |
| 5,233,482 | * 8/1993 | Galbraith et al. | 360/46 |
| 5,311,523 | * 5/1994 | Serizawa et al. | 714/794 |
| 5,430,744 | 7/1995 | Fettweis et al. | 714/795 |
| 5,625,751 | * 4/1997 | Brandwajn et al. | 706/20 |
| 5,638,065 | 6/1997 | Hassner et al. | 341/59 |
| 5,657,424 | * 8/1997 | Farrell et al. | 704/255 |
| 5,933,457 | * 8/1999 | Hottinen | 375/316 |
| 6,104,766 | * 8/2000 | Coker et al. | 375/341 |
| 6,115,427 | * 9/2000 | Calderbank et al. | 375/267 |

OTHER PUBLICATIONS

Kim, et al. (Delay–Constrained Asymptotically Optimal Detection Using Signal–Space Partitioning. IEEE: Jun. 11, 1998).*

Jeon, et al. (A Systematic Approach to Signal Space Detection, IEEE, 1997).*

Jeon et al., "Systematic Approach to Signal Space Detection", *IEEE Transactions on Magnetics*, vol. 33, No. 5, Sep. 1997, pp. 2737–2739.

* cited by examiner

*Primary Examiner*—Albert Decady
*Assistant Examiner*—Guy Lamarre
(74) *Attorney, Agent, or Firm*—R. Bruce Brodie; Marc D. McSwain

(57) ABSTRACT

A generalized method for dynamically deriving configuration information from a set of given parameters for detecting binary-valued sequences from (d, k) partial-response (PR) coded waveforms of predetermined shape, for applying the derived information to configure a processor, and for operating the configured processor as a PR detector.

11 Claims, 21 Drawing Sheets

DYNAMIC DEFINITION, CONFIGURATION, OPERATION
OF [d,k] PARTIAL RESPONSE DETECTOR

DYNAMIC DEFINITION, CONFIGURATION, OPERATION
OF [d,k] PARTIAL RESPONSE DETECTOR

GEOMETRIC INTERPRETATION OF NOMINAL SAMPLE
POINTS, ACTUAL SAMPLE POINT AND THRESHOLDS
IN 2-SPACE

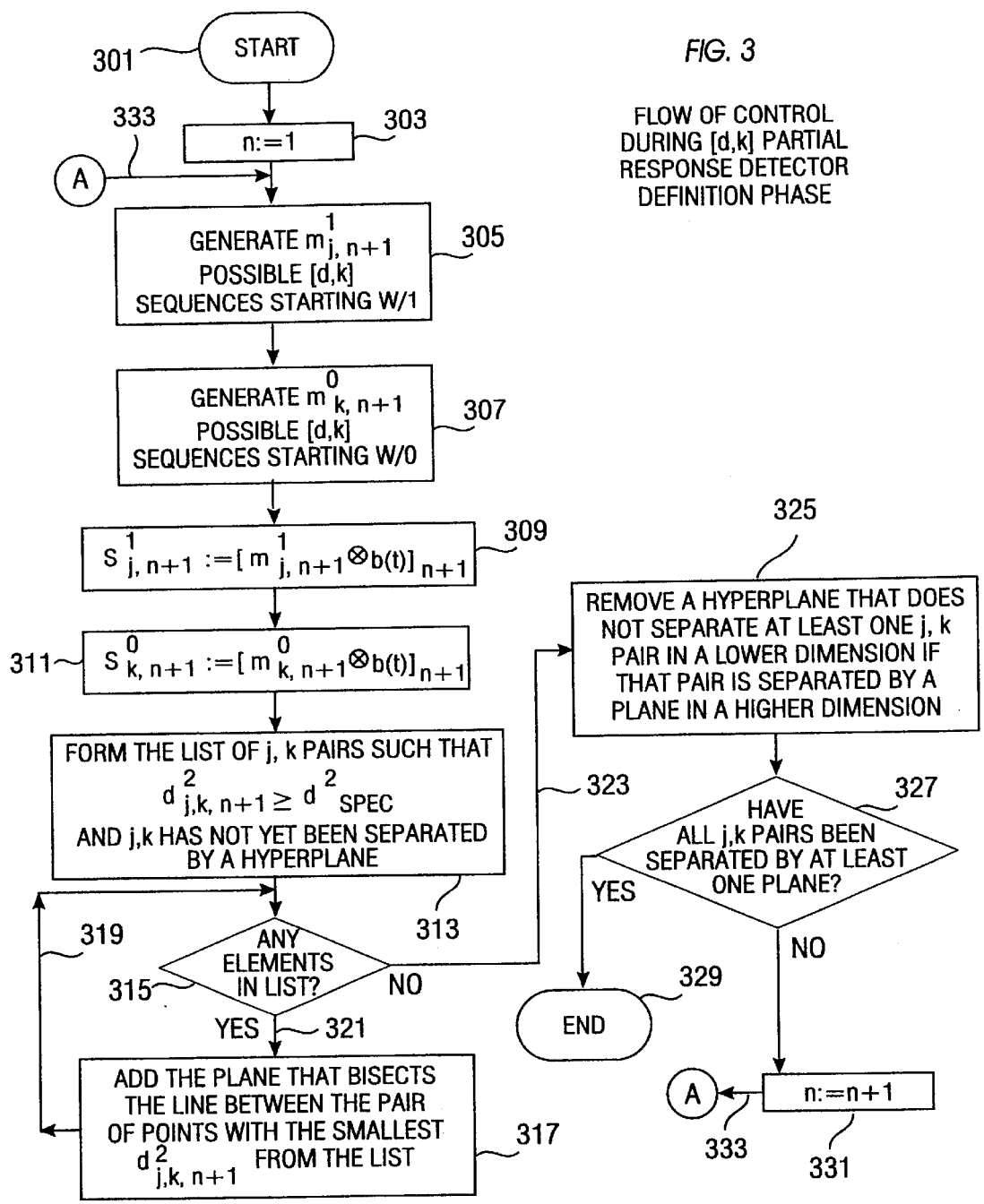

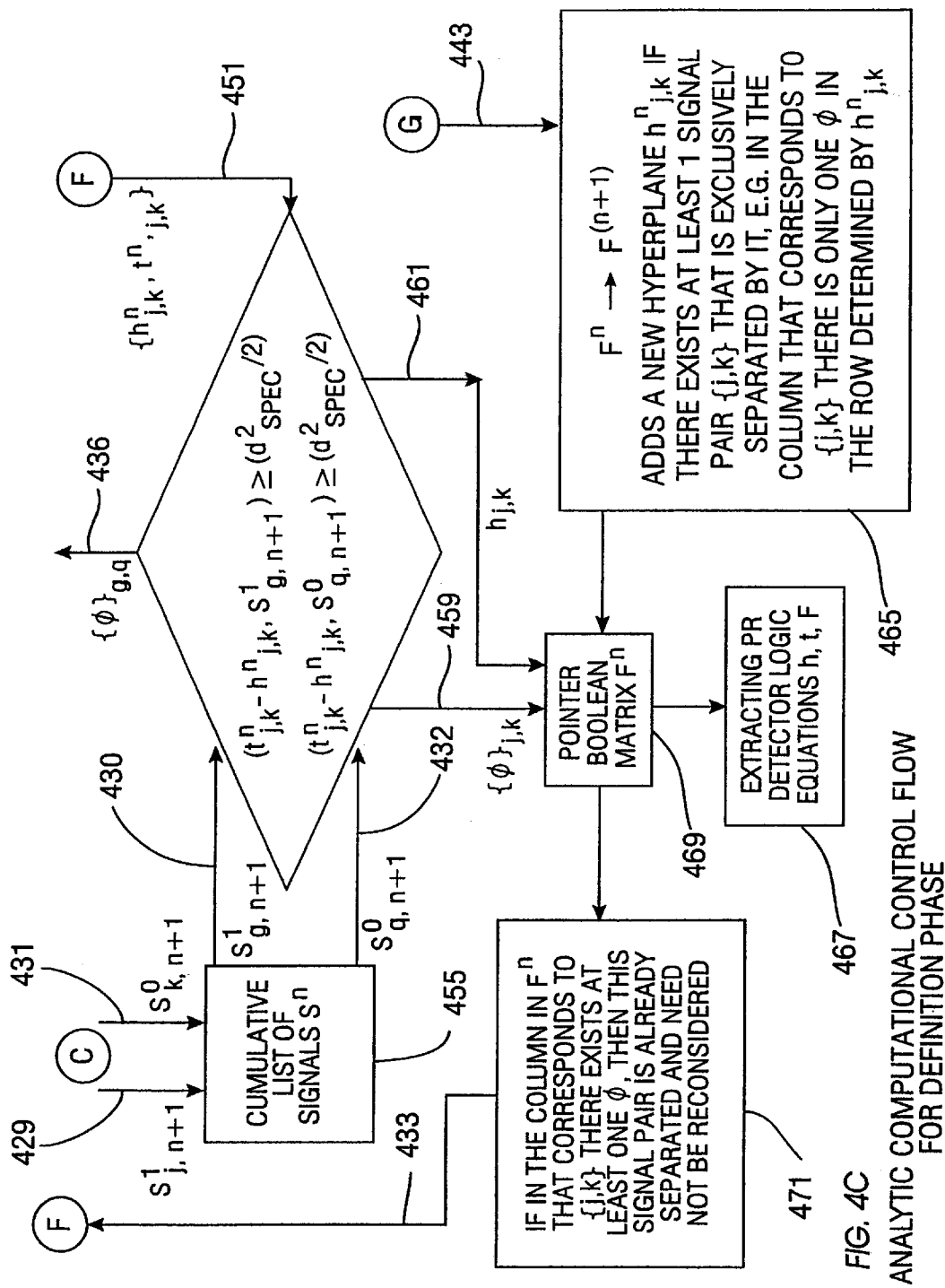
FIG. 4C  ANALYTIC COMPUTATIONAL CONTROL FLOW FOR DEFINITION PHASE

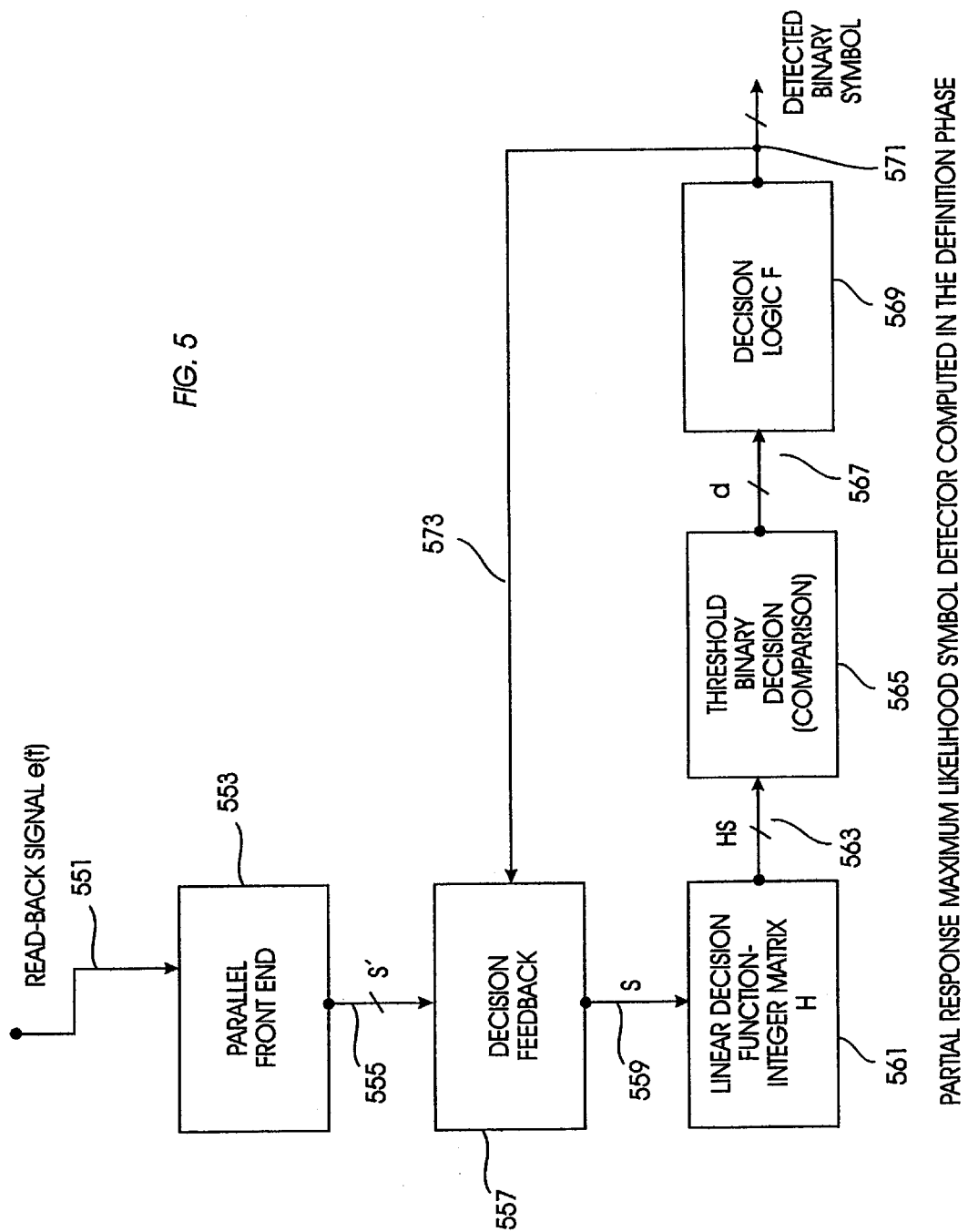

```
        ∇ DOALL[□]∇
[0]     DOALL
[1]   * HIGH-LEVEL ROUTINE THAT SETS UP THE INPUT PARAMETERS
[2]   * AND CALLS THE ROUTINES TO GENERATE THE HYPERPLANES,
[3]   * THRESHOLD VALUES, AND LOGIC EQUATIONS. THEN CALLS
[4]   * THE ROUTINE TO SIMULATE A READ OPERATION USING THESE RESULTS.
[5]   *
[6]   *
[7]   *
[8]   * FD IS THE CHANNEL RESPONSE FOR THE PARTICULAR PRML SCHEME
[9]   * 1 3 3 1 IS E2PRML
[10]    FD←1 3 3 1
[11]  *
[12]  * THE LARGEST DISTANCE SQUARED POSSIBLE FOR 1-7, E2PRML IS 10
[13]  * REQUEST AN IMPLEMENTATION THAT WILL GIVE 8
[14]    DΔSPEC←8
[15]  *
[16]  * USE A 1-7 ENCODER. IMPLICITLY USED BY CALLING THE ROUTINE GENJK
[17]  *
[18]  *
[19]  * OBTAIN THE HYPERPLANES AND THRESHOLD VALUES
[20]    GEN ΔPLANES
[21]  *
[22]  * OBTAIN THE LOGIC EQUATIONS
[23]    GEN ΔLOGIC
[24]  *
[25]  * USE THESE RESULTS TO SIMULATE READING A SECTOR OF DATA
[26]    READ
     ∇1998-07-13 11.19.04 (GMT-4)
```

(1) generates hyper-planes & threshold values;

(2) generates logic functions; and (3) configures & operates PR detector.

FIG. 6A

APL DEFINING, CONFIGURING, & OPERATING
A (d,k) PR DETECTOR

```
    ∇GEN∆PLANES[□]∇
[0]  GEN∆PLANES;n;k:JIX;NEW∆1∆POINT;NEW∆0∆POINT
[1]  * MAIN ROUTINE USED TO GENERATE HYPERPLANES AND THRESHOLD VALUES.
[2]  * HYPERPLANES SPECIFIED IN VARIABLE 'FILTER'.
[3]  * THRESHOLD VALUES SPECIFIED IN VARIABLE 'COMPARE'.
[4]  *
[5]  * SELECTED∆POINTS IS A MATRIX THAT CONTAINS THE PAIR OF POINTS
[6]  * THAT ARE USED TO GENERATE THE HYPERPLANES
[7]  SELECTED∆POINTS←2 0 1ρ0
[8]  *
[9]  * THE FIRST PASS OF THE ROUTINE IS WITH n=1, GIVING CODE VECTORS OF
[10] * LENGTH 2
[11] n←1
[12] *
[13] * ALL VALID 1-7 CODE SEQUENCES ARE GENERATED IN THE ROUTINE GENJK.
[14] *THIS ROUTINE ALSO GENERATES THE MATRIX JK WHICH IS THE CALCULATED
[15] * DISTANCES BETWEEN ALL (0...) AND (1...) VECTORS
[16] AD1:GENJK n←n+1
[17] NEGM←POSM←(0,+/ρJK)ρ0
[18] ELIM←(0,x/ρJK)ρ0
[19] SELECTED∆POINTS←SELECTED∆POINTS, 0
[20] *
[21] * MARK AS DON'T CARE THE PAIRS OF POINTS THAT HAVE BEEN PREVIOUSLY
[22] * SEPARATED BY A HYPERPLANE.  SUCH PAIRS ARE INDICATED BY PLACING A
[23] * 0 IN THE PROPER PLACE IN THE JK MATRIX.
[24] AD:→AD3 IF(ρSELECTED∆POINTS) [1]=k←0
[25] AD2:ADD K
[26] →AD2 IF(k←k+1)<(ρSELECTED∆POINTS)[1]
[27] AD3:JK←JKx(ρJK)ρ-v/[0]ELIM
[28] *
[29] * LOOK FOR THE SMALLEST NUMBER IN THE JK MATRIX THAT IS
[30] * GREATER THAN OR EQUAL TO D∆SPEC.
[31] JIX←(,JK)\|/,JK+1000xJK<D∆SPEC
[32] *
...
```

FIG. 6B

GENERATING HYPER-PLANES & THRESHOLDS

```
...
[33] * IF NO SUCH NUMBER EXISTS, NO MORE FILTERS OF THIS LENGTH
        WILL BE ADDED
[34] →AD4 IF JIX=x/ρJK
[35] *
[36] * ADD THE NEW PAIR OF POINTS TO THE PREVIOUSLY SELECTED LIST
[37] NEWΔ1ΔPOINT←JJ{(ρJJ)[0] JIX;}
[38] NEWΔ0ΔPOINT←KK{ JIX+(ρJJ)[0];}
[39] SELECTEDΔPOINTS←SELECTEDΔPOINTS,[1]NEWΔ1ΔPOINT,[¯0.5]NEWΔ0ΔPOINT
[40] *
[41] * USE THE ROUTINE ADD TO CALCULATE THE HYPERPLANE AND UPDATE
[42] * SUPPORTING MATRICES
[43] ADD ¯1+(ρSELECTEDΔPOINTS)[1]
[44] *
[45] * GO MARK NEW DON'T CARES AND TEST IF THIS DIMENSION IS COMPLETE
[46] →AD3
[47] *
[48] * USE THE ROUTINE PARE TO REMOVE HYPERPLANES OF LOWER DIMENSION
[49] * THAT ARE NOW SUPERFLUOUS.
[50] AD4:PARE
[51] *
[52] * IF ANY POINT YET REMAINS UNSEPARATED, GO TO THE NEXT DIMENSION
[53] →AD1 IF v/v/JK ≠ 0
[54]   ' THE HYPERPLANE COFFICIENTS ARE
[55]   FILTER
[56]   ' '
[57]   ' THE THRESHOLD VALUES ARE
[58]   COMPARE
[59]   ' '
       1998-07-13 11:23.24 (GMT-4)
```

H matrix threshold values t

FIG. 6B (cont.)

GENERATING HYPER-PLANES & THRESHOLDS

```
        ∇GENJK[□]∇
[0]   GENJK N;TEMP;NUMJJ;NUMKK;I;IX
[1]    * JJ IS THE MATRIX OF VALID 1-7 CODE WORDS OF LENGTH N
         STARTING WITH A 1
[2]    * KK IS THE MATRIX OF VALID 1-7 CODE WORDS OF LENGTH N
         STARTING WITH A 0
[3]      JJ←←KK←1 1ρ0
[4]   AD1:TEMP←1,KK
[5]      KK←0,KK,[0]JJ
[6]      →AD1 IF(ρJJ←TEMP)[1]<N
[7]    *
[8]    * SET ALTERNATING ONES OF THE JJ AND KK VECTORS TO
         ALTERNATING SIGNS
[9]   AD:JJ←JJx¯1+2x2|+\JJ
[10]     KK←KKx¯1+2x2|+\KK
[11]   *
[12]   * FOR THE 1-7 CODE REMOVE ANY VECTOR WHOSE FIRST 7 VALUES ARE 0.
[13]   * VECTORS WHOSE FIRST 7 BITS ARE ZERO NEED NOT BE CONSIDERED,
[14]   * DURING READING SINCE THE PREVIOUS BIT MUST HAVE BEEN A ONE.
[15]   * THIS IS A DON'T CARE SITUATION
[16]     KK←((+/^\KK=0)≤6)/[0]KK
[17]   *
[18]   * IF N IS GREATER THAN 9, CHECK FOR AN INTERNAL STRING OF
[19]   * MORE THAN 7 CONSECUTIVE ZEROS.
[20]     →BD1 IF(ρjj)[1]<9
[21]     IX←1
[22]  →BD2:JJ←((←/^\0=(0,IX)↓JJ)≤7)/[0]JJ
[23]     KK←((+/^\0=(0,IX)↓KK≤7)/[0]KK
[24]     →BD2 IF(IX←IX+1)<N-6
[25]  BD1:NUMJJ←(ρJJ)[0]
[26]     NUMKK←(ρKK)[0]
[27]   *
[28]   * CONVOLVE THE ENCODED VECTORS WITH FD.
[29]     JJ←(0,1-ρFD)↓+/[0](-⊖(NUMJJ ρ0)*.+⍳ρFD)⌽FD*.X(NUMJJ,N+¯1+ρFD)↑JJ
[30]     KK←(0,1-ρFD)↓+/[0](-⊖(NUMKKρ0)*.+⍳ρFD)⌽FD*.X(NUMKK,N+¯1+ρFD)↑KK
[31]   *
[32]   * CONSTRUCT JK, THE MATRIX OF SQUARED DISTANCES BETWEEN EACH
[33]   * VECTOR IN JJ WITH EACH VECTOR IN KK.
[34]     JK←(NUMKK,NUMJJ)ρ0
[35]     I←0
[36]  AD4:JK[;I]←⌹/(KK-((ρKK)[0]ρ0)*.+JJ[I;])x2
[37]     →AD4 IF(I←I+1)<NUMJJ
        ∇1998-07-10 12.15.19 (GMT-4)
```

FIG. 6C

APL DEFINED FUNCTIONS ANCILLARY TO HYPER-PLANE &
THRESHOLD VALUE GENERATION

```
    ∇GENM[□]∇
[0] P1 GENM P2;V;I
[1] * THIS ROUTINE SETS UP SOME PARAMETERS USEFUL
[2] * IN CALCULATING DISTANCES FROM A POINT TO A PLANE
[3] M←(0=⍳ɩoP1)*.xP1-P2
[4] V←(ρP1)↑(0.5x+/(P1*2)-P2*2)+M[0;0]
[5] M[0;]←M[0;]+M[0;0]
[6] I←1
[7] AD:→(M[0;I]=0)/'M[I;]←I= ɩoP1'
[8] →(M[0;I]≠0)/'M[I;0,I]←1, +M[0;I]'
[9] V[I]←M[I;]+.xP1
[10] →AD IF(I←I+1)<(ρM)[0]
[11] MC←V[0]
    ∇1998-07-10 12.30.49 (GMT-4)
```

FIG. 6C (cont.)

APL DEFINED FUNCTIONS ANCILLARY TO HYPER-PLANE &
THRESHOLD VALUE GENERATION

```
        ∇ADD[□]∇
[0]   ADD m;JDIST;KDIST;POS;NEG;IXJ;IXK;t1;t2
[1]   * CALCULATE THE HYPERPLANE COEFFICIENTS
[2]    FILTER←-/[0] SELECTED ΔPOINTS
[3]   *
[4]   * CALCULATE THE THRESHOLD VALUES
[5]    COMPARE←0.5x←/FILTERx←/[0]SELECTEDΔPOINTS
[6]   *
[7]   * CALCULATE THE DISTANCE FROM EACH OF THE POINTS IN THE
[8]   * CONSTELLATION TO THE LAST HYPERPLANE.
[9]    SELECTEDΔPOINTS[1;m]GENM SELECTEDΔPOINTS[0;m;]
[10]   JDIST← +/[0](((MC,[0]1 0 ⌽M+.x ⌽JJ)⊟M)- ⌽JJ)*2
[11]   JDIST←JDISTx(JJ+.xM[0;])>MC
[12]   KDIST←+/[0](((MC,[0]1 0 ⌽M+.x ⌽KK)⊟M)- ⌽KK)*2
[13]   KDIST←KDISTx(KK+.xM[0;])<MC
[14]  *
[15]  * POSM IS A MATRIX THAT CONTAINS A ROW FOR EACH HYPERPLANE AND A
[16]  * COLUMN FOR EACH POINT IN THE CONSTELLATION. A 1 INDICATES THAT
[17]  * THAT POINT IS LESS THAN D ΔSPEC+4 AWAY FROM THE HYPERPLANE IN
[18]  * THE NEGATIVE DIRECTION OR ON THE POSITIVE SIDE OF THE HYPERPLANE.
[19]  POSM←POSM,[0]POS←(t1←(JDIST,KDIST)<D ΔSPEC+4)∨(t2←(JJ,[0]KK)+.xM[0;])>MC
[20]  *
[21]  * NEGM IS A MATRIX THAT CONTAINS A ROW FOR EACH HYPERPLANE AND A
[22]  * COLUMN FOR EACH POINT IN THE CONSTELLATION. A 1 INDICATES THAT
[23]  * THAT POINT IS LESS THAN D ΔSPEC+4 AWAY FROM THE HYPERPLANE IN
[24]  * THE NEGATIVE DIRECTION OR ON THE NEGATIVE SIDE OF THE HYPERPLANE.
[25]   NEGM←NEGM,[0]NEG←t1∧t2<MC
[26]  *
[27]  * ELIM IS A MATRIX THAT CONTAINS A ROW FOR EACH HYPERPLANE AND A
[28]  * COLUMN FOR EACH PAIR OF POINTS. A 1 INDICATES THAT THE J POINT IS
[29]  * AT LEAST DΔSPEC+4 AWAY FROM THE HYPERPLANE IN THE POSITIVE
[30]  * DIRECTION AND THAT THE K POINTS IS AT LEAST D ΔSPEC+4 AWAY FROM
[31]  * THE HYPERPLANE IN THE NEGATIVE DIRECTION.
[32]   IXJ←⍳(ρJJ)[0]
[33]   IXK← (ρJJ)[0]+⍳(ρKK)[0]
[34]   ELIM←ELIM,[0],(POS[IXK]=NEG[IXK])*.^POS[IXJ]=NEG[IXJ]
     ∇1998-07-10 11.56.50 (GMT-4)
```

FIG. 6D

APL DEFINED FUNCTIONS ANCILLARY TO
HYPER-PLANE & THRESHOLD VALUE
GENERATION

```
         ∇PARE[□]∇
[0]    PARE;REMOVEΔIX;KEEPVEC;ROW
[1]    * THIS ROUTINE REMOVES HYPERPLANES THAT ARE DETERMINED
[2]    * TO BE SUPERFLUOUS.  A HYPERPLANE IS REMOVED IF THERE
[3]    * DOES NOT EXIST AT LEAST ONE PAIR OF POINTS FOR WHICH
[4]    * THAT HYPERPLANE IS THE ONLY ONE THAT SEPARATES THAT PAIR.
[5]    AD:REMOVEΔIX←(ELIM v. ^1=+/[0]ELIM)ι0
[6]    →0 IF REMOVEΔIX=ROW←(ρELIM)[0]
[7]       KEEPVEC←~REMOVEΔIX=⌐ROW
[8]       POSM←KEEPVEC/[0]POSM
[9]       NEGM←KEEPVEC/[0]NEGM
[10]      FILTER←KEEPVEC/[0]FILTER
[11]      COMPARE←KEEPVEC/COMPARE
[12]      SELECTEDΔPOINTS←KEEPVEC/[1]SELECTED ΔPOINTS
[13]      ELIM←KEEPVEC/[0]ELIM
[14]      →AD
    ∇ 1998-07-08 16.39.36 (GMT-4)
```

FIG. 6D (cont.)

APL DEFINED FUNCTIONS ANCILLARY TO
HYPER-PLANE & THRESHOLD VALUE
GENERATION

```
         ∇GEN ΔLOGIC[□]∇
[0]  GENΔLOGIC;WIDTH;J;TEMP
[1]  * THIS ROUTINE CALCULATES THE LOGIC FUNCTIONS REQUIRED TO
[2]  * DETERMINE IF THE RECEIVE POINTS SHOULD BE DECODED AS
[3]  * A 0 OR AS A 1.
[4]  * THE LOGIC EQUATIONS ARE SPECIFIED IN THE VARIABLE 'JCOVER'.
[5]  * JCOVER IS A MATRIX THAT IS TO BE INTERPRETED SUCH THAT THE
[6]  * ROWS ARE THE HYPERPLANE RESULTS THAT ARE TO BE ANDED TOGETHER,
[7]  * THEN THESE RESULTS ORED. AN EXAMPLE
[8]  *
[9]  * JCOVER
[10] *    1 2 4
[11] *    1 2 5
[12] *    3 1 0
[13] *
[14] * (F1^F2^F4) v (F1^F2^F5) v (F3^F1)
[15] *
[16] *
[17] * THE HYPERPLANES DIVIDE N-SPACE INTO A SET OF COMPARTMENTS. EACH
[18] * COMPARTMENT MAY CONTAIN ONE OR MORE J POINTS, ONE OR MORE K
[19] * POINTS, OR NEITHER A J NOR K POINT (DON'T CARE).
[20] * JCOVER IS A LOGIC EXPRESSION THAT COVERS COMPARTMENTS IN
[21] * N-SPACE THAT CONTAIN J POINTS.
[22] JCOVER←INVERT LOGIC NEGM
[23] *
[24] * NOTKCOVER IS A LOGIC EXPRESSION THAT COVERS COMPARTMENTS IN
[25] * N-SPACE THAT CONTAINS J POINTS OR NO POINTS.
[26] NOTKCOVER←LOGIC POSM
[27] WIDTH←(ρJCOVER)[1] | (ρNOTKCOVER)[1]
[28] JCOVER←((ρJCOVER)[0],WIDTH)↑JCOVER
[29] NOTKCOVER←((ρNOTKCOVER)[0],WIDTH)↑NOTKCOVER
[30] * THE FINAL LOGIC EXPRESSION MUST COVER ALL COMPARTMENTS IN
[31] * JCOVER AND MAY COVER ANY COMPARTMENTS IN NOTKCOVER THAT
[32] * MINIMIZE THE EXPRESSION.
[33] I←0
[34] AD:TEMP←(0ρ0)PROD JCOVER,[0]NOTKCOVER[I;]
[35] →((+/,TEMP=0)<+/,JCOVER≠0)/'JCOVER←TEMP'
[36] →AD IF(I←I+1)<(ρNOTKCOVER)[0]
[37] WIDTH←(ρJCOVER)[1]-|/+/^\⌽JCOVER=0
[38] JCOVER←JCOVER[;⍳WIDTH]
[39] ' THE LOGIC EQUATIONS ARE'
[40] JCOVER F
[41] ' '
     ∇1998-07-13 11.30.07 (GMT-4)
```

FIG. 6E

GENERATING LOGIC FUNCTIONS F

∇LOGIC□∇
[0]   Z←LOGIC INPM;TEMP;TERM;IL;IL1
[1]   * THE INFORMATION CONTAINED IN THE MATRIX NEGM IS SUFFICIENT TO
[2]   * DETERMINE A LOGIC EQUATION THAT WILL PRODUCE A COVER OF THE
[3]   * COMPARTMENTS IN WHICH J POINTS DO NOT EXIST.
[4]   * LIKEWISE, POSM CAN BE USED TO PRODUCE A COVER OF THE
[5]   * COMPARTMENTS IN WHICH K POINTS DO NOT EXIST.
[6]   * BY INVERTING ONE OF THESE, AND USING THE INDIVIDUAL TERMS OF THE
[7]   * OTHER AS DON'T CARES, A MINIMAL EXPRESSION CAN BE DERIVED.
[8]   *
[9]   * INPM IS ASSUMED TO BE EITHER POSM OR NEGM.  THE OUTPUT Z
[10]  * WILL THEN BE EITHER NOTK OR NOTJ.
[11]  INPM←(~^/[0]INPM)/INPM
[12]  TEMP←(ι(ρINPM)[1]*.>ι(ρINPM)[1]
[13]  INPM←(~∨/TEMP*(⌽INPM)^.=INPM)/INPM
[14]  Z←(0,20)ρ0
[15]  IL←0
[16]  AD:TEMP=INPM[IL;]/INPM
[17]  →DD IF(ρTEMP)[1]>0
[18]  Z←Z,[0](1,20)ρ20↑0,IL+1
[19]  →CD
[20]  DD:TERM←0 0ρ0
[21]   IL1←0
[22]  BD:TERM←TERM PROD 1+IL,[0.5](-TEMP[;IL1])/ι(ρTEMP)[0]
[23]   →BD IF(IL1=IL1+1)<(ρTEMP)[1]
[24]   Z←Z,[0]((ρTERM)[0],20)↑TERM
[25]   CD:Z←Z PROD 0 0ρ0
[26]   →AD IF(IL←IL+1)<(ρPOSM)[0]
[27]   Z←Z[;\20-|⌐/^\0=⌽Z]
   ∇1998-07-08 16.13.54 (GMT-4)

FIG. 6F

APL DEFINED FUNCTIONS
ANCILLARY TO LOGIC
FUNCTION GENERATION

```
    ∇PROD[☐]∇
[0]  Z←A PROD B;MAXIM;IA;IB;IC
[1]  * THIS ROUTINE PRODUCES THE PRODUCT OF TWO LOGIC FUNCTIONS,
[2]  * THEN MINIMIZES THE EXPRESSION.
[3]  * CAN BE USED SIMPLY TO MINIMIZE AN EXPRESSION BY CALLING THE
[4]  * ROUTINE WITH THAT EXPRESSION AND 0ρ0
[5]  MAXIM←1←| /(,A),,B
[6]  Z←(1,20)ρ1000
[7]  →CD IF(0=ρA)[0])^0=(ρB)[0]
[8]  ⊥(0=(ρA)[0])/'Z←B'
[9]  ⊥(0=(ρ A)[0]/'Z←A'
[10] →DD
[11] CD:IA←0
[12] AD:IB←0
[13] AD2:IC←((⊓MAXIM)εA[IA;],B[IB;])/⊓MAXIM
[14] →AD1 IF(V/^/zε0,IC)^0≠(ρZ)[0]
[15] Z←Z,[0](ρZ)[1]↑IC
[16] AD1:→AD2 IF(IB=IB+1)<(ρB)[0]
[17] →AD IF(IA←IA+1)<(ρA)[0]
[18]  Z←1 0↓Z
[19] DD:IA←0
[20] BD:→BD1 IF-(⊤/^Zε(Z[IA;],0))>1
[21]  Z←(~IA=⊥(ρZ)[0])/[0]Z
[22]  IA←IA*1
[23] BD1:→BD IF(IA←IA+1)<(ρZ)[0]
[24]  Z←(+/^\z=0)⌽Z
     ∇1998-07-08 17.43.21 (GMT-4)
```

```
    ∇INVERT[☐]∇
[0]  Z←INVERT C;IL
[1]  * THIS ROUTINE INVERTS A LOGIC FUNCTION USING DEMORGAN'S LAW
[2]  Z←0ρIL←0
[3]  AD:Z←Z PROD((C[IL;]=0)/C[IL;])*.+.0
[4]  →AD IF(IL←IL+1)<(ρC)[0]
[5]  Z←Z[;⊥(ρZ)[1]-| /+/^\0=⌽Z]
     ∇ 1998-07-08 16.17.04 (GMT-4)
```

FIG. 6F (cont.)

APL DEFINED FUNCTIONS
ANCILLARY TO LOGIC
FUNCTION GENERATION

```
 ∇READ◻∇
[0] READ;SIGN;I;LASTBIT;BINARY ΔRESULTS
[1] * THIS ROUTINE SIMULATES A READ OPERATION OF 1-7 ENCODED RANDOM
[2] * DATA. 3 VARIABLES ARE USED FROM THE ALGORITHM TO AFFECT THE LOGIC
[3] * FILTER IS A MATRIX CONTAINING THE COEFFICIENTS OF THE HYPERPLANES
[4] * COMPARE IS A VECTOR CONTAINING THE THRESHOLD VALUES
[5] * JCOVER SPECIFIES THE LOGIC EQUATIONS THAT MUST BE MET TO
[6] * PRODUCE A 1
[7] * 1-7 ENCODE A STRING OF RANDOM UNCONSTRAINED DATA
[8]   DATA17←ENCODE17 WRITE ΔDATA ←71000ρ2
[9] *
[10] * SET ALTERNATING 1 BITS TO ALTERNATING SIGN
[11]  DATA17←DATA17x-1-2x2|+\DATA17
[12] *
[13] * CONVOLVE THIS VECTOR WITH FD, 1 3 3 1 FOR E2PR
[14]  READΔDATA←FD+.x(-⍳ρFD) ⌽ (FD≠FD)*.+DATA17,(¯1+ρFD)ρ0
[15] *
[16] * INITIALIZE SOME VARIABLES
[17]  DECODEDΔDATA←0ρ0
[18]  SIGN←1
[19]  I←LASTBIT←0
[20] *
[21] * CALCULATE FILTER ΔVALUES BY VECTOR MULTIPLICATIONS OF THE FILTER
[22] * COEFFICIENTS AND VALUES OF THE READ DATA.
[23]  AD:FILTERΔVALUES←FILTER+.x((ρFILTER)[1])↑I↓READ ΔDATA
[24] *
[25] * COMPARE THESE VALUES VS THE THRESHOLD∇ VALUES OBTAINED FROM
[26] * THE ALGORITHM
[27]  BINARYΔRESULTS ←1,(SIGNxFILTER ΔVALUES)>COMPARE
[28] *
  ...
```

Annotations: "sampled data" (line [14]), "data x H matrix" (line [23]), "threshold t comparison" (line [27]).

FIG. 6G

CONFIGURES PROCESSOR ACCORDING TO THE H, t, & F PARAMETERS
AND OPERATES PROCESSOR AS A (d,k) PR DETECTOR

```
...
[29] * DECODE A 1 IF ANY OF THE LOGIC EQUATIONS IS
[30] * SATISFIED AND THE LAST DECODE WAS NOT A 1.
[31] DECODEDΔDATA←DECODEDΔDATA,
     LASTBIT←(→LASTBIT)^v/^/BINARYΔRESULTS[JCOVER]
[32] *
[33] * IF THIS BIT WAS DECODED AS A 1, SUBTRACT
[34] * OUT ITS TAIL FROM READ ΔDATA
[35] READ ΔDATA[I+⍳ρFD]←READ ΔDATA[I+⍳ρFD]-FDxSIGNxLASTBIT
[36] *
[37] * IF THIS BIT WAS DECODED AS A 1, CHANGE
[38] * THE SIGN OF THE SEARCH FOR THE NEXT BIT
[39] ⊥LASTBIT/'SIGN=-SIGN'
[40] →AD IF(I←I+1),(ρREAD ΔDATA)-ρFD
[41] *
[42] * TEST IF ANY READ ERRORS OCCURRED
[43] ' THERE WERE ',(⊤+/DECODED ΔDATA≠
     (ρDECODED ΔDATA)↑DATA17),' ERRORS'
     ▽1998-07-08 17.44.36 (GMT-4)
``` detection i.e.
1=if point above plane
0=if point below plane

FIG. 6G (cont.)

CONFIGURES PROCESSOR ACCORDING TO THE H, t, & F PARAMETERS
AND OPERATES PROCESSOR AS A (d,k) PR DETECTOR

```
          ∇ENCODE17[□]∇
[0]   Z←ENCODE17 X;t
[1]   * THIS ROUTINE ENCODES THE VECTOR X USING HASSNER'S 1-7 ALGORITHM.
[2]   * THE ENCODED VECTOR Z WILL BE 3/2 THE LENGTH OF X.
[3]   *    0 0 (x)   → 0 1 0
[4]   *    0 1 (0)   → 0 0 1
[5]   *    1 0 (x)   → 1 0 0
[6]   *    1 1 (0)   → 1 0 1
[7]   *    0 1 1 0   → 0 0 1 0 0 0
[8]   *    0 1 1 1   → 0 1 0 0 0 0
[9]   *    1 1 1 0   → 1 0 1 0 0 0
[10]  *    1 1 1 1   ← 1 0 0 0 0 0
[11]  X←X,0 0
[12]  Z←0ρ0
[13]  AD:Z←Z,X[0],(-∨/X[0],t),(t←X[1]^←^/X[2 3]),(^/X[1 2])/0 0 0
[14]  →AD IF(ρX←(2x1+^/X[1 2])↓X)>2
   ∇ 1998-07-13 11.14.20 (GMT-4)
```

FIG. 6H

APL DEFINED FUNCTION ANCILLARY TO OPERATION OF
PROCESSOR AS A (d,k) PR DETECTOR

GENERALIZED METHOD AND MEANS FOR DEFINING AND OPERATING A (D, K) PARTIAL-RESPONSE ML DETECTOR OF BINARY-CODED SEQUENCES

FIELD OF THE INVENTION

This invention relates to the maximum likelihood (ML) detection of binary-coded sequences derived from run-length-limited (RLL) partial response analog waveforms. These waveforms are used in disk recording channels and the like. More particularly, the invention relates to a generalized method and means for defining and operating ML detectors for any particular type of [d, k] partial response channel or waveform.

DESCRIPTION OF RELATED ART

One result of digital information processing is the production of binary-coded sequences. When the sequences are to be stored on a disk drive or the like, it is customary to first add additional bits representing an error correction coding (ECC) artifact. Next, the sequences are sent through a run-length-limited (RLL) or modulation encoder and a partial response (PR) channel. The modulation encoder and partial response channel are designed to impart clocking information to the binary sequence and to transform this enriched sequence into a highly recoverable analog pattern when read back from the storage medium. The actual recorded signals on a disk drive track are Gaussian-shaped peaks and valleys varying over time.

When the recorded signals are read back, it is necessary to invert the process. In this regard, recorded signals are first applied to a PR decoder or detector. The PR detector output is in the form of a binary-coded sequence enriched with the modulation code and the ECC artifact. The former is stripped off by the RLL or modulation decoder. The result is then applied to an ECC decoder for any necessary error detection and correction.

The present magnetic storage track recording environment is characterized by high signal density, intersymbol interference (ISI), and white Gaussian noise. PR is the current response to increasing densities and speed, and replaces peak detection as the method of choice.

PR detection comprises two parts. These are ascertaining the PR signal from the storage medium and assigning the actual PR signal to a binary sequence on a maximum likelihood basis. That is, a binary sequence is correlated with a valid PR signal to which a detected signal is most closely associated. In this regard, the permissible PR signals having the noise-free and signal space location attributes can be determined in advance. Thus, when an actual PR signal encrusted with some noise is detected, its location (Euclidean distance) with respect to the location of every one of the permissible signals can be resolved based on the shortest or minimum distance.

As used in this specification, the term "distance" connotes Euclidean distance $d^2$ rather than the code theory term "Hamming" distance. The Euclidean distance metric $d^2$ is the sum of the squares of the differences between a pair of vectors. If a reference waveform produces a vector of sample values $[x_1 x_2 x_3 x_4]$ and a readback waveform yields values taken at the sample times of $[y_1 y_2 y_3 y_4]$, then the Euclidean distance $d^2$ is taken to be $$d^2 = \Sigma(x_1-y_1)^2 + (x_2-y_2)^2 + \ldots + (x_n-y_n)^2.$$

The PR detector comprises a signal sampler and an ML detector. In this regard, the PR signal is sampled one or more times at a predetermined self-clocked rate. This set of samples is termed a "vector of samples" and is then applied to a Viterbi or equivalent detector. The Viterbi detector is a well-known finite state machine (FSM) configured to process samples. It resolves a noisy sample to the closest one of the nominal or "known" nonnoisy samples using traversal of a special purpose directed graph called a trellis. Such processing is described in Fettweis et al., U.S. Pat. No. 5,430,744, "Method and Means for Detecting Partial Response Waveforms Using a Modified Dynamic Programming Heuristic", issued Jul. 4, 1995. Unfortunately, the trellis processing, as exemplified in Fettweis, is complex in function, structure, and operation and costly.

There have been other approaches to processing RLL or (d, k) constrained PR waveforms. These have been of the finite lookahead decision feedback ML detector type. For instance, Patel, U.S. Pat. No. 4,945,538, entitled "Method and Apparatus for Processing Sample Values in a Coded Signal Processing Channel", issued Jul. 31, 1990, sought to reduce the complexity of trellis-based, bit-by-bit detection. Patel assumed that most errors in reading from a [d, k] partial response channel are due to peaks shifted by one clock period or cycle.

In general, Patel's solution was the use of a linear filter in his lookahead decision feedback FSM to increase the Euclidean distance between events for a (1, 7) EPR4-coded channel. The [d, k]=(1, 7) means that there is inserted at least one "0" and not more than seven "0's" between a pair of consecutive "1's" in any binary sequence. An EPR4 type of partial response signal means that the nominal or noise-free signal, if sampled at the Nyquist rate, would yield relative magnitudes 1-2-1 at those sample times. This means that there exists a "target waveform" of a peak shape that has been "equalized". If the equalized target waveform were sampled at its Nyquist frequency, then three samples would be obtained at three clock times during its excursus. The waveform at the sample times should have magnitudes respectively of 1, 2, and 1.

Hassner, U.S. Pat. No. 5,638,065, "Maximum-likelihood Symbol Detection for RLL-coded Data", issued Jun. 10, 1997, is directed to binary sequence ML detection of waveforms from a (1, 7) $E^2PR4$ channel. This PR waveform is sampled four times with a nominal relative amplitude of 1-3-3-1. Whereas Patel is limited to detecting one bit at any time, Hassner modified Patel's FSM to detect bits in parallel (actually four bits/cycle) or one symbol at a time. While Hassner utilizes the linear filter and bit clock of the Patel '538 patent, he additionally utilizes a symbol clock.

Jeon et al., "Systematic Approach to Signal Space Detection", *IEEE Transactions on Magnetics*, Vol. 33, No. 5, September 1997, pp. 2737–2739, emphasize the use of a finite delay decision tree (FDTS) in their finite lookahead decision feedback (FSM) detector. The FDTS operates as a form of signal space partitioning and as an approximation to the Viterbi detector. Conceptually, Moon's nominal sample values are mapped into an N-dimensional space. Hyperplanes are passed through this N-dimensional space, thereby partitioning the nominal sample values according to predetermined criteria. As embodied in a detector, the estimation of one or more detected samples in this N-space is then made using the nearest neighbor rule (minimal Euclidean distance).

SUMMARY OF THE INVENTION

It is accordingly an object of this invention to devise a method and apparatus for defining and operating a partial response detector for any given partial wave shape h, [d, k]

RLL modulation code, minimum Euclidean distance $d^2_{min}$ of [d, k] coded PR wave, and minimum Euclidean distance $d^2_{spec} \leq d^2_{min}$ specified for PR detector performance.

It is still another object that such method and apparatus for defining and operating a [d, k] PR detector be utilizable by [d, k] PR waves of the PR4, EPR4, and $E^2PR4$ types and the like.

It is yet another object that such method and apparatus exhibit less operational and structural complexity than that exhibited by a Viterbi-type trellis PR detector.

The foregoing objects are believed satisfied by a method and apparatus in which logic equations governing PR detector operations are first defined from a predetermined set of parameters comprising the PR shape h, [d, k] RLL code, $d^2_{min}$, and $d^2_{spec} \leq d^2_{min}$. The definition of the PR detector is expressed in a series of logic equations involving a linear decision function integer matrix H, a vector of threshold values t, and decision logic F. A processor is then configured according to the equations to emulate the defined (d, k) PR detector for sampling, evaluating applied (d, k) partial response waveforms, and for extracting the appropriate binary sequences on an ML basis.

In the PR detector of this invention, after equalization, adjacent samples of the readback signal are stored in a shift register structure implemented by analog integrators. The linearly weighted sum of the register contents is compared to a set of thresholds. From this bit vector, the detector logic finally calculates the binary sequence, which corresponds to the sequence of input samples. Feedback is used to subtract the effect of previous transitions.

Each set of N samples can be regarded as points in an N-dimensional space. Relatedly, a PR detector responsive, for instance, to signals from a (1, 7) $E^2PR4$ channel, must distinguish between permissible sequences starting with 1 (or –1) and those starting with 0. From a geometric viewpoint, the detection problem reduces to distinguishing groups of points, which have the sequence-starting attribute of 0 or 1. The solution is to introduce a set of hyperplanes which establishes partitions in an N-dimensional space so that each partitioning is exclusively occupied by representatives of one of the groups. Thus, a subset of these hyperplanes separates the 0-group from the 1-group. The detection decision is made by identifying the partition to which the sampled point belongs. The partition is identified by simultaneously evaluating linear equations of the coordinates of the sample and comparing the results to a fixed threshold.

In one embodiment, a processor executes APL routines to derive the logic equations and configures itself into a PR detector. It then executes other APL routines and samples the PR waveforms, processes the samples, and assigns binary sequences on an ML basis.

In another embodiment, after defining the PR detector dynamically through a computation such as that described in the Hassner '065 patent, the sampled waveform is applied to the defined PR detector. The detector calculates, in parallel from the analog waveform, symbols constituting analog-valued vectors. This is done by integrating, in parallel, the analog signal samples as weighted by a preselected set of weighting functions orthogonal over a time duration representing a symbol period that is an integral multiple of a bit-clock period and assigning a binary-coded sequence associated with that calculated analog-valued vector closest to the analog-valued vector of the instant waveform on an ML basis.

BRIEF DESCRIPTION OF THE DRAWING

FIG. 3 sets out a general flow of control of the definition phase in which starting PR shape, RLL constraints, and Euclidean distance parameters are transformed into logic equations representing matrix, threshold, and decision logic.

FIGS. 4A–4C show an analytic flow of control of the definition phase as set out in FIG. 3.

FIG. 5 illustrates a high-level data pathing for a partial response ML detector incorporating the matrix, threshold of, and decision logic defined by the operations depicted in FIGS. 2 and 3.

FIGS. 6A–6H depict a software-based embodiment of a (1, 7) $E^2PR4$ symbol detector configured as APL code executable in any requisite Von Neumann processor or the like for dynamically defining the [d, k] partial response detector, configuring the processor, and operationally performing as a PR detector according to the invention.

DESCRIPTION OF THE PREFERRED EMBODIMENT

General Nature of a Dynamically Derived and Operational Device

The preferred embodiment comprises a phase for first deriving the attributes of the PR detector from predetermined defining characteristics, a phase for configuring a processor such as one utilizing the interpretive APL language to operate as the newly defined PR detector, and a phase for employing the configured APL processor as a PR detector.

Figure 1:
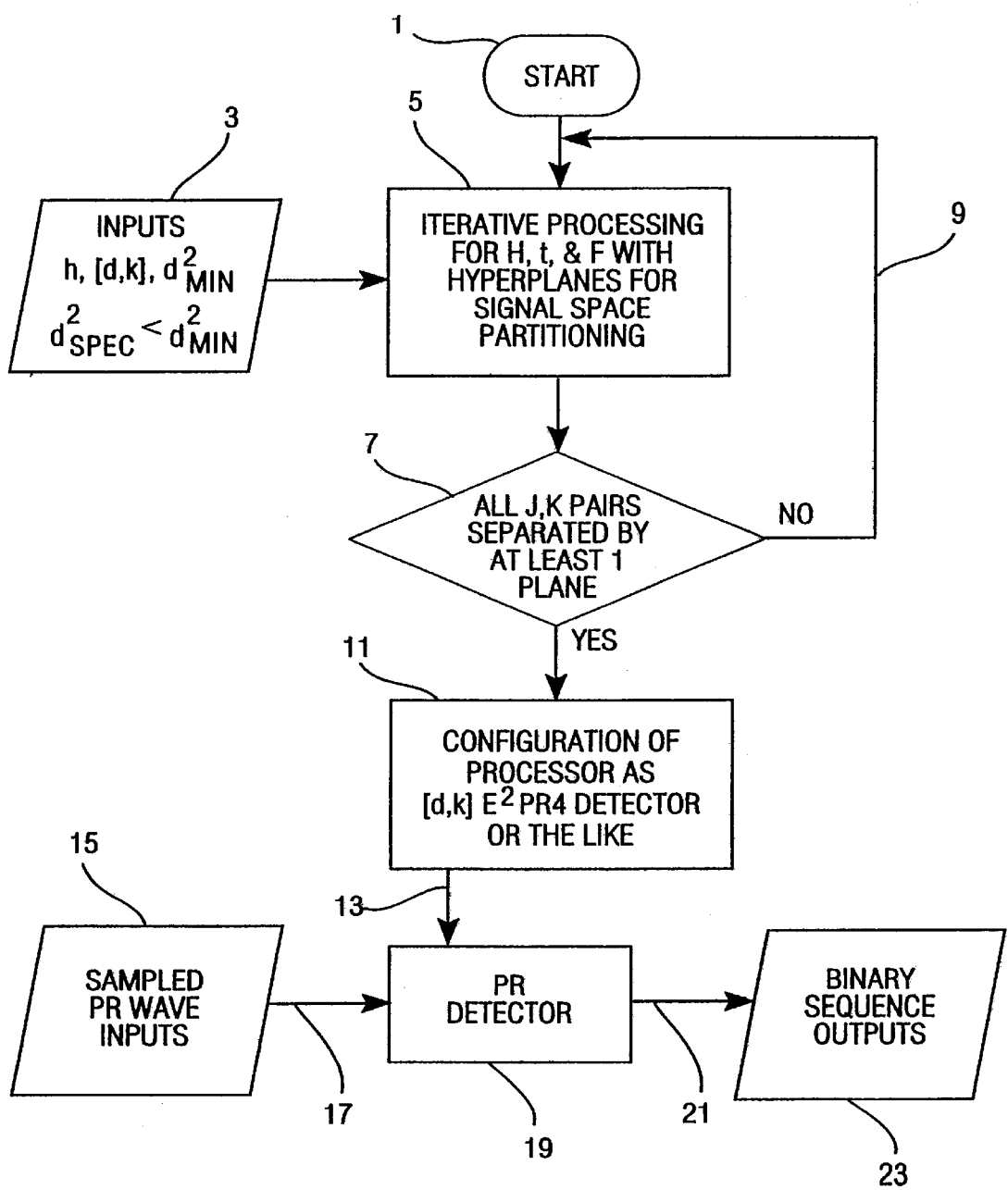
FIG. 1 depicts a general flow of control of the definition, configuration, and execution phases of the method of this invention.

Referring now to FIG. 1, there is shown a flow of control of the dynamic definition, configuration, and operation of a [d, k] partial response detector. The phase moves from its starting step 1 and iteratively produces logic equations at step 5 from the predetermined defining characteristics in input step 3 such as a partial wave shape h, specific [d, k] RLL or modulation code, minimum Euclidean distance $d^2_{min}$ between RLL-coded PR signals, and $d^2_{spec} \leq d^2_{min}$ specified for detector performance.

The PR detector is of the maximum likelihood type. The function of the derivative step 5 is to produce a linear decision function integer matrix H, one or more binary decision thresholds t, and decision logic F. Parenthetically, the logic F utilizes H and t to effectuate the Boolean output function yielding a detected binary symbol. Both the detection process and the derivation of H, t, and F are described using a geometric interpretation of mapping nominal RLL codepoints progressively into higher degree geometric spaces and utilizing hyperplanes to separate permissible pairs of RLL sequences. Noisy samples are then resolved with reference to the minimum distance between the sample and the nominal codepoints.

The iterative processing takes place in steps 5, 7, and 9 until all RLL codepoints are separated by at least one plane. In this regard, the derived equations are expressed in the form of tabular or matrix data constructs. These constructs are presented in step 11 and utilized by a processor having an interpretive program language capability of either a special or general type. In this embodiment, an APL sequence causes the processor, as parameterized by the tabular or matrix data constructs, to behave as if it were a partial-response detector 19. Sampled PR waits are applied as inputs in step 15 to the PR detector 19 over path 17. The PR detector operating over several samples generates binary sequence outputs in the form of binary symbols over path 21 in step 23.

Referring now to FIG. 5, there is shown the functional logic defining a PR maximum-likelihood symbol detector for a [d, k] PR channel. In this regard, a sampled readback signal e(t) is applied to the front-end logic 553 over path 551. A subtractor 557 eliminates the effect of the immediate past decision by removing any output artifact from the sample string S'. The output artifact (binary symbol) is fed back from output 571 over path 573. The output S of subtractor 557 is applied to a linear decision function matrix H to access an argument HS from the memory 561. Resolution is accomplished by applying HS to threshold element 565 and decision logic F in element 569 over path 563. The PR detector, when operating as a processor, preferably comprises at least a Pentium 2 microchip employing an IBM APL2 program product running under a Windows 95® operating system or equivalent. One APL program product that can be used is the IBM "APL2 for Windows", Product No. 5639-D46, Part No.4229558.

Aspects of an Interpretive Language Processor —APL

It should be appreciated that APL is a well-established interactive language system. It also serves as a system of mathematical-like notation. APL typically executes on a system including a keyboard, raster display, and an intercoupling processor. This includes the facilities to construct, modify, and execute software dynamically. This further includes the direct processing of entire data structures. This derives from the use of a general data structure, namely, the heterogenous array or matrix, with the consequential ability to define powerful operations on this structure. Descriptions of APL and its facilities may be found in Gilman et al., "APL: An Interactive Approach", 3rd Edition, John Wiley Publishing Company, 1984; Polivka et al., "APL: The Language And Its Usage", Prentice-Hall Publishing Company, 1975; and "APL,2 Programming: Language Reference", IBM publication SH20-9227-1. APL also operates in a stand-alone program execution mode, either interpretively or as compiled object code. An example of an APL processor communicatively executing in a stand-alone mode with other processors is set out in Brown et al., U.S. Pat. No. 4,736,321, "Communication Method Between an Interactive Language Processor Workspace and External Processes", issued Apr. 5, 1988.

Partial Geometric Interpretation of the Detection of Coded Binary Data from Sampled Digitized Analog Signals (PR Waveforms)

Figure 2:
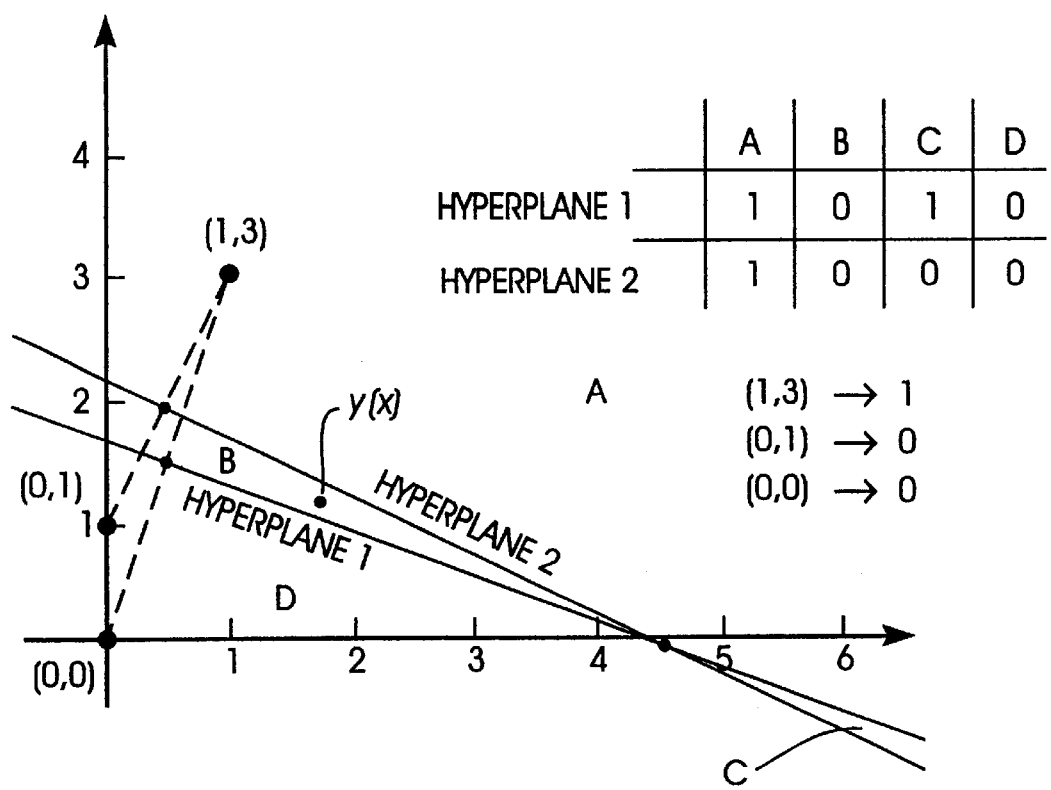
FIG. 2 depicts a 2-dimensional space in which hyperplanes are passed among the clusters of codepoints in the definitional phase of the invention.

Referring now to FIG. 2, there is shown a geometric interpretation of nominal sampled points, an actual sampled point, and thresholds in two-space. Relatedly, if the permissible RLL-coded sampled points are written into an N-dimensional space, the relevant detection issue is to determine, among the cluster of points, which one was actually written or recorded for a given sequence of samples. Each nominal "point" represents a value sampled from a PR waveform of a given shape h at its Nyquist rate that is not affected by noise. Noise can be thought of as a "cloud" surrounding each of the points. The geometric task is to pass planes between the points in a predetermined manner to enable discernment or selection of one or more points based upon an optimization of an attribute, such as Euclidean distance.

Let us now consider a (1, 7) RLL modulation code having a shape in a 2-dimensional detection space. First, 2-dimensional space admits only two bits of information per sequence. Thus, of the four possible sequences, namely, 00, 01, 10, constraint of the [d, k]=(1, 7). That constraint states that there must be at least one "0" and no more than seven "0's" between consecutive "1's".

As may be recalled, the target sample values for an $E^2PR4$ waveform is 1-3-3-1. The three permissible RLL sequences 00, 01, and 10 constitute $E^2PR4$ waveform samples (0, 0), (0, 1), and (1, 3). These $E^2PR4$ waveform samples are shown mapped in the 2-dimensional plane shown in FIG. 2. In this plane, the ordinate and the abcissa are the x and y values, respectively. Thus, the permissible sequences (0, 0) and (0, 1) are mapped directly on the ordinate, while remaining (1, 3) value is located well into the space.

In the absence of noise, the sampled signal values as read back from the disk track would be one of those three, namely (0, 0), (0, 1), or (1, 3). However, in the presence of noise, the signal sample read back would be located at, say, y(x) in FIG. 2 between threshold 1 and threshold 2. The thresholds 1 and 2 are in the form of a plane transverse to cutting into the plane of the paper. Considering threshold 2 as the detection comparator of interest, if y(x) were located on the left side of the threshold nearest to the points (0, 0) and (0, 1), then sampled value y(x) would be decoded as a binary 0. On the other hand, if the sample y(x) were located on the right side of threshold 2 containing the point (1, 3), then y(x) would be decoded as a binary 1. It should be observed that threshold 2 maximally separates the points within a pair such as (0, 1) and (1, 3), and it also separates the other member of the group (0, 0) from (1, 3).

If threshold 1 were used, it would maximally separate pairs of points differently from that of threshold 2. Indeed, the location of y(x) would dictate a detection outcome different from that when threshold 2 was used. Significantly, a hyperplane should separate a pair of points equally distant and with at least the minimum Euclidean distance.

Geometric Interpretation of the Iterative Separation of Nominal (d, k) PR-coded Points in a High-dimensional Signal Space During the Definition Phase Referring now to FIG. 3, there is shown the flow of control during the definition phase of the [d, k] partial-response detector. The object of this phase is to transform a selected set of starting parameters into any expanded set of constructs defining the detector and rendering it suitable for immediate operation. This phase starts at step 301 and it is iterative until all the pairs of points (permissible nominal sampled valued sequences) have been separated in an N-dimensional signal space by at least one hyperplane. The first steps are concerned with the generation of possible [d, k]=(1, 7) RLL sequences of length n. In this regard, step 305 seeks to generate permissible RLL code sequences $m^1_{j,n+1}$ that start with a binary 1 of length (n+1). Likewise, step 307 generates all permissible RLL code sequences $m^0_{k,n+1}$ that start with a binary 0 of length (n+1).

In FIG. 3, steps 309 and 311 convolve the generated permissible sequences $m^1_{j,kn+1}$ and $m^0_{k,n+1}$ with the PR channel impulse response h(t) to derive the permissible PR-shaped sequences $S^1_{j,n+1}$ and $S^0_{k,n+1}$ such that:

$$S^1_{j,n+1} = M^1_{j,n+1} \otimes h(t)$$

$$S^0_{k,n+1} = M^0_{k,n+1} \otimes h(t).$$

Where (d, k)=(1, 7), $d^2_{spec}$ =7, for n=2, the permissible RLL sequences are 000, 001, 010, 100, and 101. The $E^2PR4$ shape of 1-3-3-1 yields a convolved channel response of (000), (001), (013), (133), (132) where the 0 starting sequences are (000), (001), and (013), while the 1 starting sequences are (133) and (132).

Step 313 calls for forming a list of (j, k) pairs satisfying two criteria, namely, a minimal Euclidean distance greater than a specified magnitude and that the pairs have not yet been separated by a hyperplane. For the above example, the following would be the list:

TABLE 1

|       | (133)        | (132)           |
|-------|--------------|-----------------|
| (000) | 19           | 14              |
| (001) | 14           | 11              |
| (013) | 05 - marked  | 06 - marked next |

This shows six pairs of points (j, k) and the distance $d^2$ there between. Since it is presumed for this iteration that there are elements present in the list, control passes to step 317. According to this step, if the pair (013, 133) had been marked 0 as having been separated during a first iteration through steps 315, 321, 317, and 319 since it had the lowest distance, then the pair (013, 132) should be marked during the present iteration since it has the next lowest distance. This iteration is repeated until there are no more elements in the list. Control then passes to steps 325 and 327.

The steps ensure that all (j, k) pairs of points have been separated by at least one plane, and that a plane separating a pair of points in a higher dimension precludes the separation of the same pair of points by a plane in a lowered dimension. In the event that not all (j, k) pairs of points had been separated by at least one plane, then the dimension variable n is permitted in step 331 and the points are analyzed in the next higher dimension with the transfer of control over path 333 and returning to step 305. This is repeated until the desired separation of points has been effectuated as tested by step 327. Upon this condition being satisfied, the process terminates in step 329.

Figure 4A:
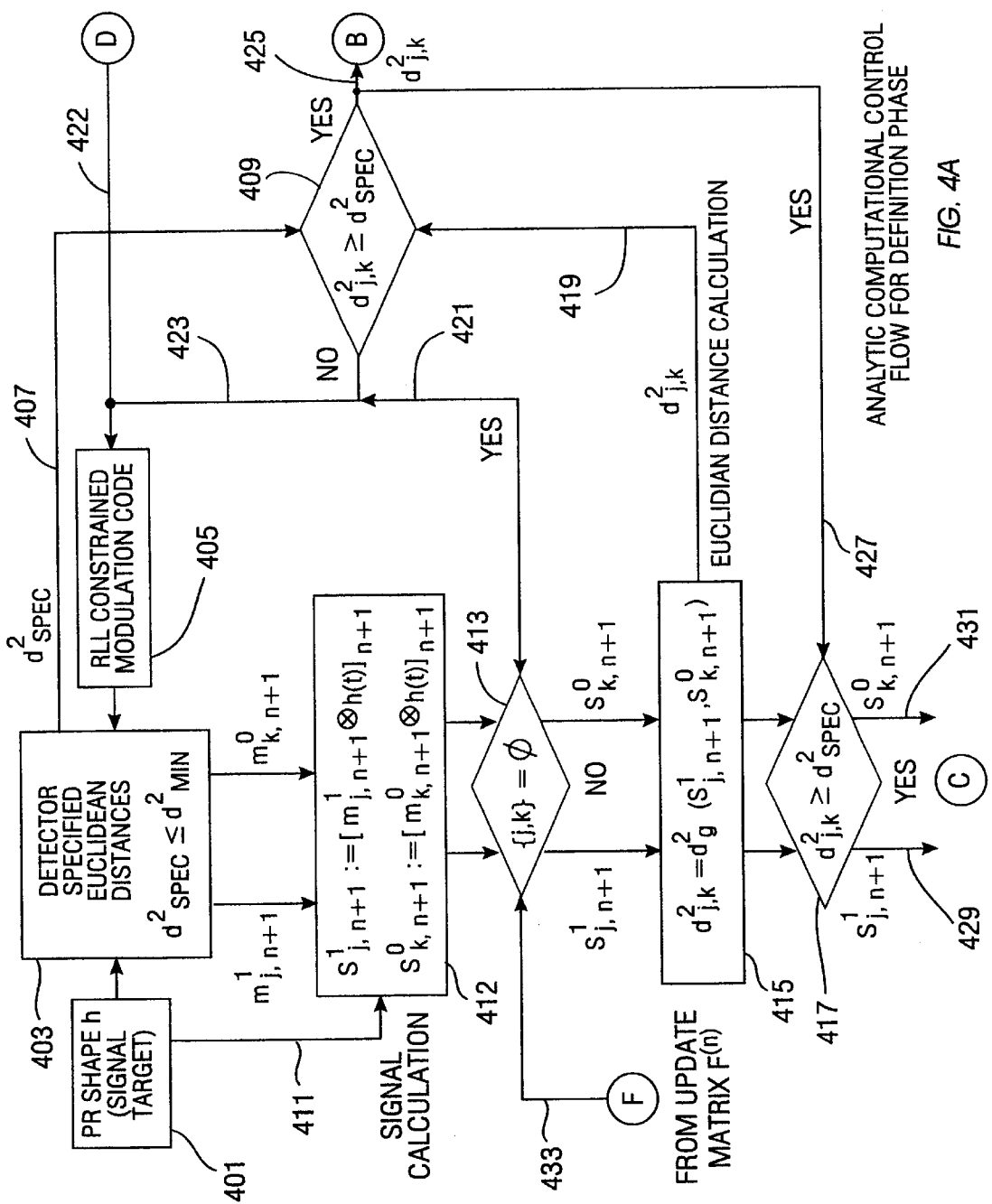
Figure 4B:
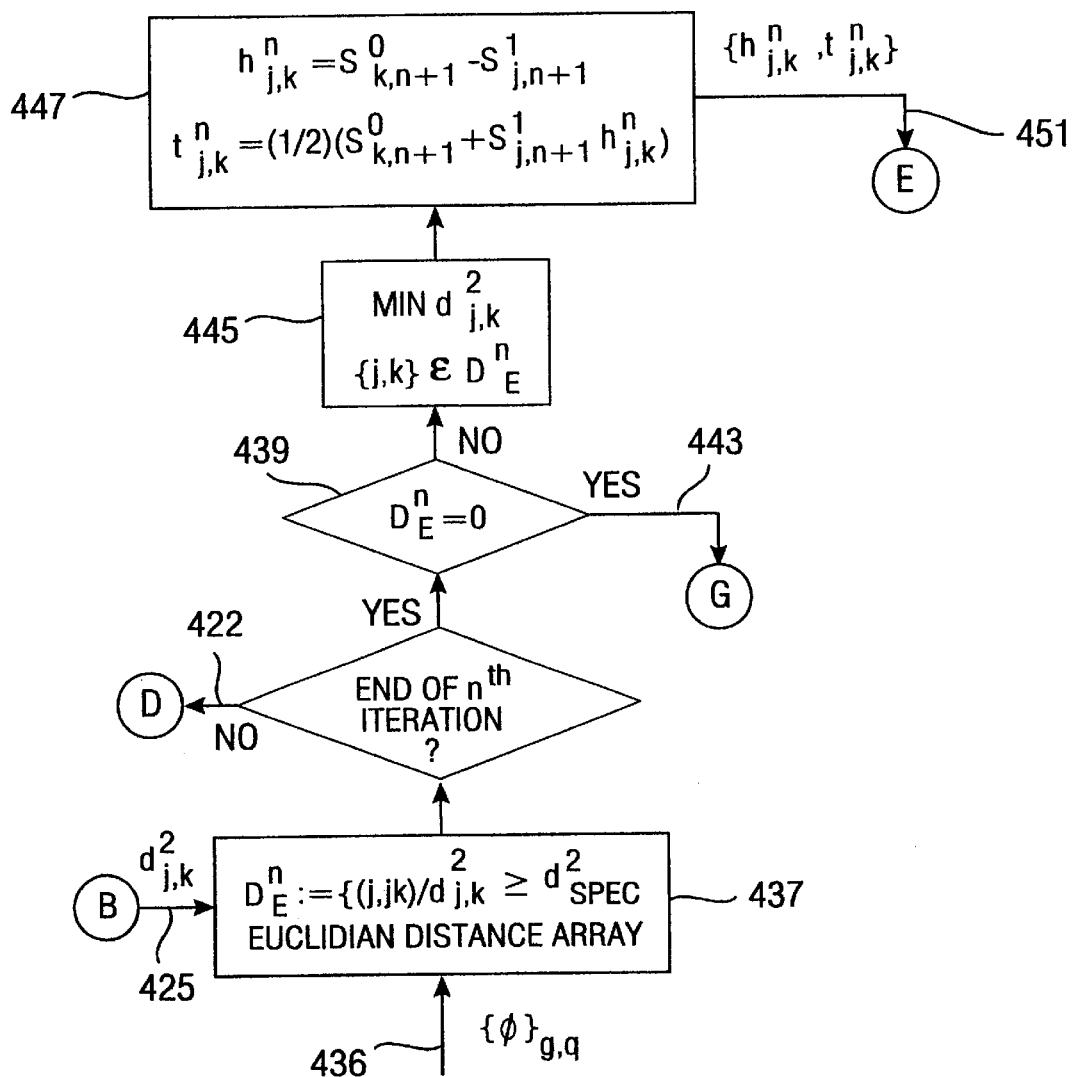

Analytic Control Flow in the Definition Phase Including Partitioning Nominal (d, k) PR-coded Sample Points, Computation of H, t, and F Expressions and Values Referring now to FIGS. 4A–4C, there is shown an analytic control flow for the definition phase that parallels the functional description associated with FIG. 3. The inputs to the algorithm are the PR signal or wave shape h={hk} in step 401, the (d, k) RLL code constraints in step 405, and the minimum Euclidean distance $d^2_{min}$ between the (d, k) PR signals (see above) and $d^2_{spec} \leq d^2_{min}$ in step 403. The locution for the process during the $n^{th}$ iteration of converting these parameters into H, t, and F may be listed as follows:

(a) Generate a set of (d, k) coded binary vectors $\{m_{g,n+1}\}$ of n+1 bits in length.

(b) Separate $\{m_{g,n+1}\}$ into $\{m^1_{j,n+1}\}$ of sequences prefixed by 1 and $\{m^0_{k,n+1}\}$ of sequences prefixed by 0.

(c) Convolve (steps 412, 413, 421) each $\{m^1_{j,n+1}\}$ and $\{m^0_{k,n+1}\}$ with the PR shape h and truncate the result beyond (n+1). Therefore all (n+1) clock signal vectors are generated such that $S^1_{n+1} = \{S^1_{j,n+1}\}$ and $S^0_{n+1} = \{S^0_{k,n+1}\}$.

(d) Calculate (steps 415, 417, 419) Euclidean distance $[d^2_{j,k}]$ matrix $D^n$ whose rows and columns are labeled by the sets $\{S^1_{n+1}\}$ and $\{S^0_{n+1}\}$, respectively.

(e) In Euclidean distance matrix $D^n$, locate (steps 429, 431, 455, 430, 432) all entries $d^2_{j,k} \geq d^2_{spec}$ where the signal pair {j, k} has not yet been separated by a hyperplane.

(f) Perform the following ad seriatim:

(1) generate (steps 457, 459, 469) the set of signal pairs {j, k} such that $d^2_{j,k} \geq d^2_{spec}$ and that has not yet been separated by a hyperplane.

(2) If the set contains no elements, begin iteration (n+1) as in step 413. Otherwise, continue processing the elements of the set.

(3) Select the pair {j, k} such that $d^2_{j,k}$ is the smallest in the set.

(4) Separate these points (step 465) by the integral bisecting decision plane $h^n_{j,k} = s^0_{k,n+1} - s^1_{j,n+1}$.

With the threshold given by the vector product:

(5) mark this pair by $\phi$= don't care.

(6) For this hyperplane and each pair of signals ($s^0_{k,n+1}$, $S^1_{j,n+1}$) that has not yet been marked as a "don't care", calculate the distances of their projections from the threshold $t^n_{j,k}$–($h^n_{j,k}$, $s^0_{k,n+1}$) and $t^n_{j,k}$–($h^n_{j,k}$·$s^1_{j,n+1}$) and mark those pairs {g, q} for which the above numbers equal or exceed $d^2_{spec}/4$ as "don't cares".

(7) Remove those pairs from the set and repeat steps (1)–(7) until the set is empty.

(g) Check overlaps with previous hyperplanes and eliminate old hyperplanes provided the new ones covered the signals they have separated. This is achieved by maintaining a Boolean and pointer matrix $F^{n-1}$ whose rows are labeled by the hyperplane filters $h^n_{j,k}$ and whose columns are labeled by all the pairs of signals ($s^0_{k,n+1}$, $s^1_{j,n+1}$). The entries in this matrix are either 1 if the filter that labels the row also separates the pair {j, k} that labels the column, or 0 otherwise. The pointer matrix $F^{n-1}$ keeps track of the overlaps. These are used to generate the update from $H_{n-1}$ to $H_n$. Thus, the addition of a new filter made results in deletions of previous filters provided the new filter covers the signal sets separated by previous ones.

This algorithm calculates an integer matrix H, a real threshold vector t, and a Boolean logic equation F. These are used to configure the PR detector shown in FIG. 5.

APL Software-oriented Dynamically Defined and Operating (d, k) PR Detector

Referring now to FIGS. 6A–6H, there is shown a software-based embodiment of a (1, 7) $E^2PR4$ symbol detector configured as APL code executable in any requisite Von Neumann processor or the like. The APL code dynamically defines the (d, k) partial-response detector, configures the processor, and operationally performs as a PR detector according to the invention.

The APL routines set out in FIGS. 6A–8H defining the PR detector, configuring it and operating it are heavily commented and are expressed in the form of APL-defined functions and operators. The following general comments are offered to clarify and explain aspects of the APL language syntax which may facilitate understanding of the software execution dynamics.

The APL language was based on simple homogenous array data structures of type number or character. In today's APL2 version, the homogenous array has been generalized to a herterogenous array. This means that an array can include literal as well as numerical values. APL is characterized as being an interactive language and one that can directly process entire data structures. In APL, the primitive operations accept whole arrays of arguments and produce whole arrays of results. A large class of primitive operators are built in, including many which create, destroy, and modify arrays. Each APL primitive is defined as a function which returns a value. From these primitive functions, extremely powerful expressions may be constructed.

APL control structures are simple. Within expressions, there is no hierarchy of operations and right-to-left associativity is used. Between statements and some programs, a simple "go to" is provided. This allows a computed statement number "[#]" and recursive subprogram calls. Subprograms are subjected to at most two arguments transmitted by value and a single result. However, the ability to accept array arguments and return array results in any subprogram makes these restrictions relatively minor.

Subprograms have the form of a simple sequence of statements, each of which has a system-generated line number and which may, in addition, have an extrinsically supplied label. Go-to statements may designate their object either by a line number or statement label. A subprogram may have a designated set of local identifiers. Existing associations for these identifiers are deactivated on subprogram entry and reactivated on subprogram exit. Nonlocal referencing obeys the most recent association rule. APL does not use the concept of a main program. Subroutine execution is initiated by a call from another subprogram. For external storage, programs and data are grouped into "workspaces".

Each workspace may contain various programs and data structures. System commands are provided to allow workspace to be brought into central memory from external storage and stored back again after being updated. A typical APL implementation historically has been based on interpretive program execution. Two per static storage area are allocated, one for system routines and one for the current workspace. The workspace area contains some static storage for system data and three dynamic storage areas. These include a stack for subprogram activation records such as local referencing environments and return points, a heap for array storage and storage of bodies of defined subprograms, and a table of global identifier associations. Arrays are stored with full run-time descriptors in the usual sequential simulation.

Referring now to FIG. 6A, there is shown the APL-defined function "DOALL". Significantly, this function defines, configures, and invokes PR detector operations in a single pass. This is accomplished by calling three key-defined subordinate functions, namely, "GENdelPLANES", "GENdelLOGIC", and "READ" at lines [20], [23], and [26], respectively. The GENdelPlanes and GENdelLOGIC functions are directed to generating hyperplanes and threshold values for defining the PR detector. The READ function configures and operates the PR detector.

In DOALL, the starting parameters are assigned at various points in the sequence. For instance, the PR shape factor h=1 3 3 1 is assigned as a vector in line [10]. The Euclidean distance $d_{spec}^2=8$ is assigned as a value in line [14]. The parameter (d, k)=(1, 7) is used implicitly by virtue of a call to a defined function "GENJK" embodying that parameter as set out in FIG. 6C and line [16] thereof. In this regard, the DOALL function assigns variables to these parameters and then proceeds to call the defining functions GENdelPlanes and GENdelLOGIC. It subsequently calls the READ function in line [26] for processor configuration and detector operation.

Referring now to FIG. 6B, there is shown the GENdelPlanes defined function for generating hyperplanes and threshold values. Significantly, the hyperplane coefficients are set out in an H matrix at line [55], while the thresholds t are set out in the compare instruction at line [58]. The flow of control is generally patterned after the flow shown in FIG. 3.

Relatedly, the APL-defined functions and FIGS. 6C–6D operate in either a subroutine or coroutine relationship with the hyperplane threshold value generating functions GENdelPLANES. Of some interest is the fact that the defined function GENJK in FIGS. 6C–6D maintains the matrix of all valid binary-valued codewords of length n starting with a binary 1 or a binary 0 satisfying a (d, k)=(1, 7) constraint in lines [3]–[6]. Also, these vectors are convolved with the PR shape factor h in lines [29]–[30]. The Euclidean distances between each vector are calculated in lines [34]–[37].

Referring now to FIG. 6E, there is set out the defined function GENdelLOGIC for deriving the logic required to determine if received points sampled from a recorded or transmitted PR waveform should be decoded as a binary 0 or a binary 1. In this function, the logic equations are specified in a variable denominated as "JCOVER" as explained in the comments between codelines [4]–[21]. The critical result is denominated as the logic F is presented for communication to other defined functions on codeline [40].

Referring now to FIG. 6F, there is shown a set of ancillary APL-defined functions in subroutine or coroutine relation with the GENdelLOGIC defined function. These include functions for deriving logic equations producing a cover in which a predetermined number of points do not exist to routine-producing logic inversion and implementing DeMorgan's theorem.

Referring now to FIGS. 6G–6H, there are set out the APL-defined functions for configuring the processor according to the filter H, the thresholds t, and the decision logic F, and for operating the processor as the [1, 7] $E^2PR4$ detector. The sample data appears in FIG. 6G at codeline [14]. The sample data is processed through the H filter by multiplying the sample data vector by the H matrix at codeline [23]. The filter or output is compared with threshold values at codeline [27]. The detected or decoded vector results are generated at codeline [31]. Thus, if a sample datapoint were located above a hyperplane, then it would be decoded as a binary 1, while if relocated below the given hyperplane, it would be decoded as a binary 0. It should be noted that the Encode APL-defined function in FIG. 6H influences the Adler-Hassner encoding algorithm set out in Adler et al., U.S. Pat. No. 4,413,251, "Method and Apparatus for Generating a Noiseless Sliding Block Code for a (1, 7) Channel with Rate ⅔", issued Nov. 1, 1983.

Figure 7:
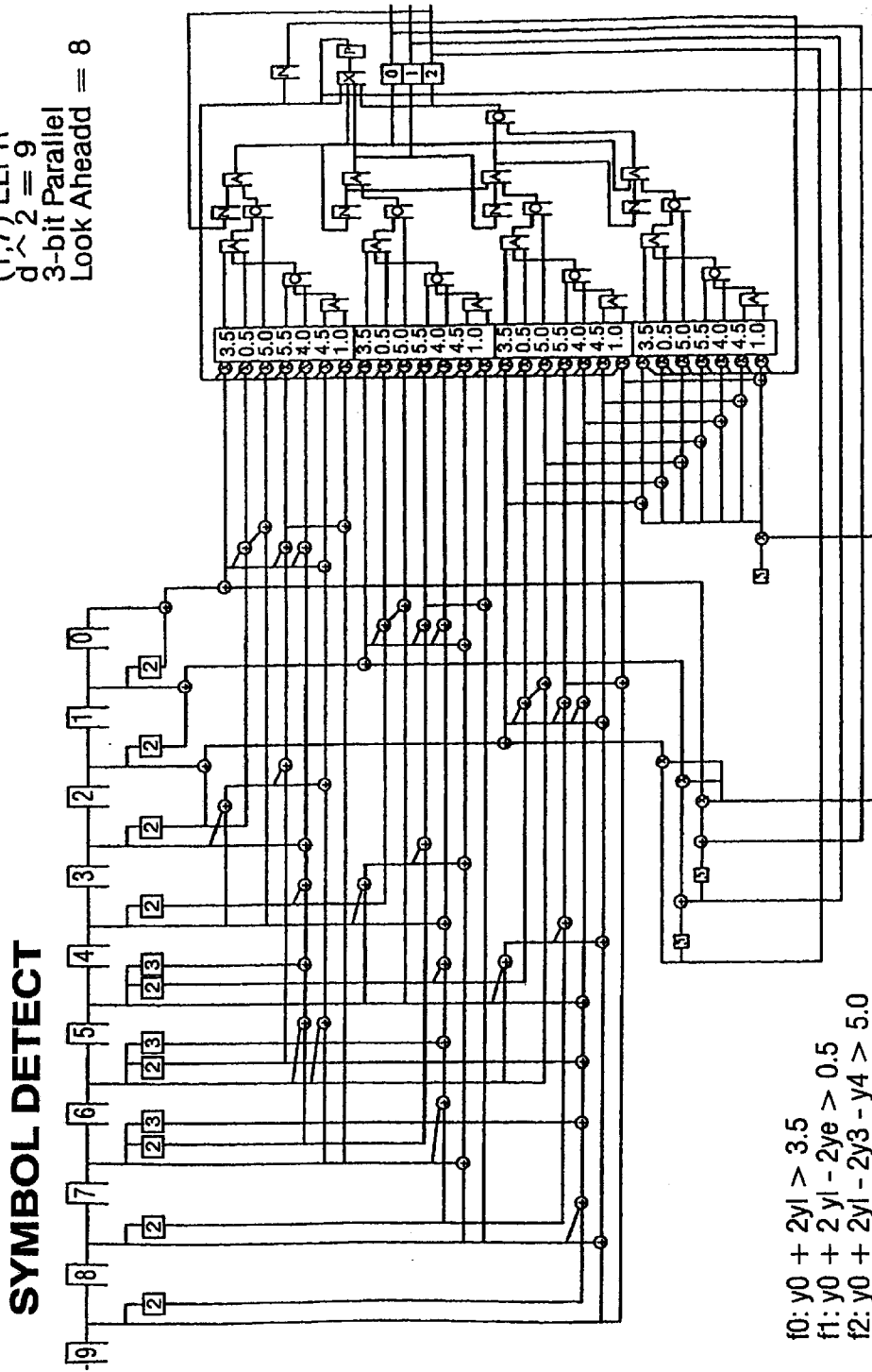
FIG. 7 illustrates a hard-wired embodiment of a (1, 7) $E^2PR4$ symbol detector configured as a transversal filter and combinatorial logic according to the definition phase of the invention.

FIG. 7 illustrates a hard-wired embodiment of a (1, 7) $E^2PR4$ symbol detector configured as a transversal filter and combinatorial logic according to the definition phase of the invention. The logic equations F are included in the figure for purposes of completeness.

While the invention has been described with respect to an illustrative embodiment thereof, it will be understood that various changes may be made in the method and means herein described without departing from the scope and teaching of the invention. Accordingly, the described embodiment is to be considered merely exemplary and the invention is not to be limited except as specified in the attached claims.

What is claimed is:

1. A method for maximum-likelihood (ML) detection of binary-valued sequences from a (d, k) partial-response (PR) coded analog waveform comprising the steps of:
   (a) dynamically defining and configuring a (d, k) PR detector from a predetermined set of PR-related parameters according to a geometric model interpreting nominal noise-free sample points and thresholds in a multidimensional signal space; and
   (b) applying actual sampled PR signals to the defined and configured PR detector and assigning a binary-coded sequence associated with that nominal noise-free sample point closest to the actual sampled signals on an ML basis wherein said geometrical model utilizes hyperplanes selected via adaptive optimization to partition nominal noise-free sample points according to Euclidean distance metrics as thresholds.

2. The method according to claim 1, wherein said PR detector includes a processor and a resident interpretive language having a set of array manipulating promitives, defined functions, and a locus of control to effectuate definition, configuration, and operation of said PR detector as a function of subroutining and coroutining among the defined functions.

3. A method for maximum-likelihood (ML) detecting of binary-valued sequences from (d, k) partial-response (PR) coded analog waveforms comprising the steps of:
   (a) deriving a set of expressions defining a finite feedback ML detector having a particular linear decision function matrix H, a threshold binary decision function t, and a decision logic F, said expressions being derived from a predetermined PR shape h, modulation code (d, k), minimum Euclidean distance $d^2_{min}$ of (d, k) coded PR waveforms, and minimum distance $d^2_{spec} \leq d^2_{min}$ for a specified detector lookahead performance, and defining a particular instance of an ML detector in a processor as a function of the set of expressions;
   (b) applying a sampled PR waveform to the particular ML detector and calculating, in parallel from the analog waveform, symbols constituting analog-valued vectors by integrating, in parallel, the analog signal weighted by a preselected set of weighting functions orthogonal over a time duration representing a symbol period that is an integral multiple of a bit-clock period; and
   (c) assigning a binary-coded sequence associated with that calculated analog-valued vector closest to the analog-valued vector of the instant waveform on an ML basis.

4. The method according to claim 3, wherein step (a) further comprises the substeps of invoking an emulation of a finite lookahead decision feedback ML detector by an interpretive language processor, and configuring the detector emulation with the set of expressions.

5. The method according to claim 4, wherein the language processor is formed from an interpretive language processor having a set of array manipulating primitives, defined functions, and a locus of control to effectuate definition, configuration, and operation of said PR detector as a function of subroutining and coroutining among the defined functions.

6. The method according to claim 5, wherein said interpretive language processor is selected from a set consisting of APL, NIAL, BASIC, FORTH, and C programming language subsystems.

7. The method according to claim 3, wherein the step of deriving the set of expressions for H, t, and F from the predetermined PR shape h, modulation code (d, k), and Euclidean distances $d^2_{min}$ and $d^2_{spec} \leq d^2_{min}$, comprises the substeps of:
   (a1) generating permissible (d, k) coded binary sequences $m^1_{j,n+1}$ and $m^0_{k,n+1}$, respectively, starting with a binary 1 and with a binary 0;
   (a2) obtaining permissible nominal PR sample values $S^1_{j,n+1}$ and $S^0_{k,n+1}$ by convolving the sequences $m^1_{j,n+1}$ and $m^0_{k,n+1}$ with the PR shape h(t) response;
   (a3) forming a list of unseparated pairs of $S^1_{j,n+1}$ and $S^0_{k,n+1}$ and their Euclidean distances $d^2_{j,k,n+1} \geq d^2_{spec}$ and passing a hyperplane construct between that pair having the smallest distance $d^2_{j,k,n+1}$, removing the pair from the list, and repeating the step of passing hyperplanes until list exhaustion;
   (a4) assuring that all pairs $S^1_{j,n+1}$ and $S^0_{k,n+1}$ have been separated by at least one hyperplane including reiteration of steps (a1)–(a4).

8. The method according to claim 7, wherein the step (a4) includes the steps of:
   (a4$_i$) detecting separation of a given pair $S^1_{j,n+1}$ and $S^0_{k,n+1}$ by a hyperplane in a first dimension;
   (a4$_{ii}$) detecting separation of the given pair by another hyperplane in a second and lower-order dimension; and
   (a4$_{iii}$) removing any hyperplane separating any given pair $S^1_{j,n+1}$ and $S^0_{k,n+1}$ in the second- and lower-order dimension.

9. A method for maximum-likelihood (ML) detecting of binary-valued sequences from a (d, k) partial-response (PR) coded analog waveforms comprising the steps of:
   (a) deriving information constructs from a predetermined PR shape h, modulation code (d, k), minimum Euclidean distance $d^2_{min}$ of (d, k) coded PR waveforms, and minimum distance $d^2_{spec} \leq d^2_{min}$ for a specified detector lookahead performance, said information constructs include:
      (1) a matrix H of pairs of nominal (d, k) PR-coded sampled values as partitioned into an N-dimensional signal space according to predetermined hyperplanes, the location of the planes being arranged with reference to bisecting pairs of values satisfying the Euclidean distance constraints in at least one of the dimensions of the N-dimensional signal space,
      (2) a set of thresholds t correlated with the hyperplanes and assigning a binary value decision for any given location of any actual PR sample, and
      (3) Boolean combinatorial logic expressions for providing signal indication of each binary-valued decision;
   (b) configuring a processor according to the information constructs;
   (c) applying a sampled PR waveform to the configured processor and calculating, in parallel from the analog waveform, symbols constituting analog-valued vectors by integrating, in parallel, the analog signal weighted by a preselected set of weighting functions orthogonal over a time duration representing a symbol period that is an integral multiple of a bit-clock period; and
   (d) assigning a binary-coded sequence associated with that calculated analog-valued vector closest to the analog-valued vector of the instant waveform on an ML basis.

10. An apparatus for maximum-likelihood (ML) detection of binary-valued sequences from a (d, k) partial-response (PR) coded analog waveform comprising:
   (a) a stored program-controlled processor dynamically defined and configured for operation as a (d, k) PR detector from a predetermined set of PR-related parameters according to a geometric model interpreting nominal noise-free sample points and thresholds in a multidimensional signal space;
   (b) input circuits for applying actual sampled PR signals to the processor as a defined and configured PR detector; and
   (c) an arrangement including said processor for assigning a binary-coded sequence associated with that nominal noise-free sample point closest to the actual sampled signals on an ML basis.

11. An article of manufacture comprising a machine-readable memory having stored therein a plurality of processor-executable control program steps for maximum-likelihood (ML) detection of binary-valued sequences from a (d, k) partial-response (PR) coded analog waveform, said control program steps include:
   (a) a control program step for forming, dynamically defining, and configuring a (d, k) PR detector from a predetermined set of PR-related parameters according to a geometric model interpreting nominal noise-free sample points and thresholds in a multidimensional signal space; and (b) a control program step for applying actual sampled PR signals to the defined and configured PR detector and assigning a binary-coded sequence associated with that nominal noise-free sample point closest to the actual sampled signals on an ML basis.

* * * * *